(12) United States Patent
Friend

(10) Patent No.: US 10,797,665 B2
(45) Date of Patent: Oct. 6, 2020

(54) PROGRAMMABLE GAIN AMPLIFIER SYSTEMS AND METHODS

(71) Applicant: SYNAPTICS INCORPORATED, San Jose, CA (US)

(72) Inventor: Brian Friend, Carlsbad, CA (US)

(73) Assignee: SYNAPTICS INCORPORATED, San Jose, CA (US)

(*) Notice: Subject to any disclaimer, the term of this patent is extended or adjusted under 35 U.S.C. 154(b) by 8 days.

(21) Appl. No.: 16/234,496

(22) Filed: Dec. 27, 2018

(65) Prior Publication Data

US 2020/0212861 A1 Jul. 2, 2020

(51) Int. Cl.
*H03F 3/45* (2006.01)
*H03G 3/30* (2006.01)
*H03F 3/185* (2006.01)
*H03F 3/21* (2006.01)

(52) U.S. Cl.
CPC ........... *H03G 3/3005* (2013.01); *H03F 3/185* (2013.01); *H03F 3/211* (2013.01); *H03F 3/45183* (2013.01); *H03F 2200/03* (2013.01); *H03F 2200/129* (2013.01); *H03F 2200/21* (2013.01); *H03F 2200/222* (2013.01); *H03F 2200/228* (2013.01); *H03F 2200/234* (2013.01); *H03F 2200/462* (2013.01); *H03F 2203/21103* (2013.01)

(58) Field of Classification Search
CPC .... H03F 3/45; H03F 3/45165; H03F 3/45363; H03F 3/45461
USPC .................................. 330/253, 258, 254, 261
See application file for complete search history.

(56) References Cited

U.S. PATENT DOCUMENTS

| | | | |
|---|---|---|---|
| 6,300,837 B1 | 10/2001 | Sowlati et al. | |
| 6,369,653 B1 | 4/2002 | Kappes | |
| 6,388,523 B1 | 5/2002 | Kappes | |
| 6,791,418 B2 | 9/2004 | Luo et al. | |
| 8,581,661 B2 | 11/2013 | Friend et al. | |
| 8,810,317 B2 | 8/2014 | Kadoi et al. | |
| 8,928,408 B2* | 1/2015 | Zanchi | H03F 3/005 330/253 |
| 9,276,525 B2 | 3/2016 | Friend et al. | |
| 2002/0050861 A1 | 5/2002 | Nguyen et al. | |

(Continued)

OTHER PUBLICATIONS

Written Opinion and International Search Report for International App. No. PCT/US2019/068623, 10 pages.

*Primary Examiner* — Steven J Mottola
(74) *Attorney, Agent, or Firm* — Haynes and Boone, LLP

(57) ABSTRACT

Systems and methods for amplifying an input signal include amplifier circuitry, an itail connection coupled between a positive voltage circuitry and the negative voltage circuitry and operable to generate an itail voltage corresponding to a greater of the positive voltage input signal (Vp) and the negative voltage input signal (Vn), a first resistor rgp disposed to receive the itail voltage and a first voltage corresponding to Vp, and a second resistor rgn disposed to receive the itail voltage and a second voltage corresponding to Vn. A first current output node is coupled to the output of rgp and operable to output a positive output current (Ioutp) corresponding to the current flowing through rgp, and a second current output is coupled to the output of rgn and operable to output a negative output current (Ioutn) corresponding to the current flowing through rgn.

20 Claims, 6 Drawing Sheets

(56) References Cited

U.S. PATENT DOCUMENTS

| | | |
|---|---|---|
| 2002/0118065 A1 | 8/2002 | Miyamoto |
| 2005/0024142 A1 | 2/2005 | Sowlati |
| 2011/0095823 A1 | 4/2011 | Gilbert et al. |
| 2014/0247091 A1 | 9/2014 | Friend et al. |
| 2016/0034094 A1 | 2/2016 | Kang et al. |
| 2018/0131359 A1 | 5/2018 | Crespi et al. |

* cited by examiner

PROGRAMMABLE GAIN AMPLIFIER SYSTEMS AND METHODS

TECHNICAL FIELD

The present disclosure, in accordance with one or more embodiments, relates generally to programmable gain amplifiers, and more particularly for example, to programmable gain amplifiers for use in sensor input systems.

BACKGROUND

Programmable gain amplifiers (PGAs) are used in a variety of electronic systems. In sensor input systems, for example, programmable gain amplifiers are used to amplify a small input signal from the sensor (e.g., a microphone in an audio input system) to produce a larger output signal, which may then be used for digital signal processing. The design of a programmable gain amplifier is often driven by one or more competing design requirements, including a high signal to noise ratio (SNR) over a wide gain range (e.g., Av=0 to 21 dB), high linearity and low total harmonic distortion (THD), low power consumption, a high input impedance (e.g., to minimize loading on the sensor), a small device size, and low manufacturing cost. Accordingly, there is a continued need for improved programmable gain amplifier designs and methods that meet or exceed various design criteria while reducing the design trade-offs of conventional systems.

SUMMARY

Systems and methods for improved programmable gain amplifiers for use in sensor input systems are disclosed herein.

In various embodiments, a method includes amplifying a difference between a positive voltage input signal (Vp) and a negative voltage input signal (Vn) to generate an amplified differential output voltage comprising a positive voltage output signal (Voutp) and a negative voltage output signal (Voutn), and generating an itail voltage corresponding to a greater of the positive voltage input signal (Vp) and the negative voltage input signal (Vn). In some embodiments, the method may further include generating, by a sensor in response to sensed phenomena, the positive voltage input signal (Vp) and the negative voltage input signal (Vn).

In various embodiments of the method, the itail voltage and a first voltage corresponding to the positive voltage input signal (Vp) are applied to a first resistor (rgp) to generate the positive voltage output signal (Voutp), and the itail voltage and a second voltage corresponding to the negative voltage input signal (Vn) are applied to a second resistor (rgn) to generate the negative voltage output signal (Voutn). The method may further include outputting a positive output current (Ioutp) corresponding to the current flowing through the first resistor (rgp), wherein if the positive voltage input signal (Vp) is greater than the negative voltage input signal (Vn), the positive output current (Ioutp) is proportional to the positive voltage input signal (Vp) minus the negative voltage input signal (Vn), and outputting a negative output current (Ioutn) corresponding to the current flowing through the second resistor (rgn), wherein if the negative voltage input signal (Vn) is greater than the positive voltage input signal (Vp), the negative output current (Ioutn) is proportional to the negative voltage input signal (Vn) minus the positive voltage input signal (Vp).

In some embodiments of the method, amplifying the difference between the positive voltage input signal (Vp) and the negative voltage input signal (Vn) to generate the amplified differential output voltage further includes generating a positive voltage difference signal corresponding to the difference between the positive voltage input signal (Vp) and the positive voltage output signal (Voutp), and generating a negative voltage difference signal corresponding to the difference between the negative voltage input signal (Vn) and the negative voltage output signal (Voutn). The method may further comprise generating, by a first bias circuit, first gate control signals to drive a first transistor to correct for the positive voltage difference signal, and a third transistor to produce a positive current (Ip) and a common mode current (Icm), and generating, by a second bias circuit, second gate control signals to drive a second transistor to correct for the negative voltage difference signal and a fourth transistor to produce a negative current (In) and the common mode current (Icm). In some embodiments, the positive output current (Ioutp) is generated from the positive current (Ip) and the common mode current (Icm), and wherein the negative output current (Ioutn) is generated from the negative current (In) and the common mode current (Icm).

The method may further include sensing current output voltages of positive output current (Ioutp) and negative output current (Ioutn) and creating common mode feedback to maintain a predetermined interface voltage, transmitting the positive output current (Ioutp) and the negative output current (Ioutn) to an analog to digital converter, and/or adjusting, using variable gain resistors, a gain applied to the positive voltage output signal (Voutp) and the negative voltage output signal (Voutn).

In some embodiments of the method, the positive current (Ip) is proportional to the difference between the positive voltage input signal (Vp) and the positive voltage output signal (voutp), and the negative current (In) is proportional to the difference between the negative voltage input signal (Vn) and the negative voltage output signal (voutn).

In some embodiments, a system includes amplifier circuitry, an itail connection, a first resistor (rgp), a second resistor (rgn), a first current output and a second current output. The amplifier circuitry may include positive voltage circuitry operable to receive and process a positive voltage input signal (Vp) and negative voltage circuitry operable to receive and process a negative voltage input signal (Vn), the amplifier circuitry operable to generate an amplified differential output voltage comprising a positive voltage output signal (Voutp) and a negative voltage output signal (Voutn). The itail connection may be coupled between the positive voltage circuitry and the negative voltage circuitry, the itail connection operable to generate an itail voltage corresponding to a greater of the positive voltage input signal (Vp) and the negative voltage input signal (Vn).

In various embodiments, the amplifier circuitry further includes a first operational amplifier operable to generate a positive voltage difference signal corresponding to the difference between the positive voltage input signal (Vp) and the positive voltage output signal (Voutp), and a second operational amplified operable to generate a negative voltage difference signal corresponding to the difference between the negative voltage input signal (Vn) and the negative voltage output signal (Voutn). The amplifier may further include a first bias circuit operable to generate first gate control signals to drive a first transistor to correct for the positive voltage difference signal, and a third transistor to produce a positive current (Ip) and a common mode current (Icm), and a second bias circuit operable to generate second gate control signals to drive a second transistor to correct for the negative voltage difference signal and a fourth transistor to produce a negative current (In) and the common mode current (Icm).

The first resistor (rgp) is disposed to receive the itail voltage and a first voltage corresponding to the positive voltage input signal (Vp) and is operable to generate the positive voltage output signal (Voutp). The a second resistor (rgn) is disposed to receive the itail voltage and a second voltage corresponding to the negative voltage input signal (Vn) and is operable to generate the negative voltage output signal (Voutn).

The first current output node is coupled to the output of the first resistor and operable to output a positive output current (Ioutp) corresponding to the current flowing through the first resistor (rgp), wherein if the positive voltage input signal (Vp) is greater than the negative voltage input signal (Vn), the positive output current (Ioutp) is proportional to the positive voltage input signal (Vp) minus the negative voltage input signal (Vn), otherwise the positive output current (Ioutp) is approximately zero.

The second current output node is coupled to the output of the second resistor and operable to output a negative output current (Ioutn) corresponding to the current flowing through the second resistor (rgn), wherein if the negative voltage input signal (Vn) is greater than the positive voltage input signal (Vp), the negative output current (Ioutn) is proportional to the negative voltage input signal (Vn) minus the positive voltage input signal (Vp), otherwise the negative output current (Ioutn) is approximately zero.

In some embodiments, the positive output current (Ioutp) is generated from the positive current (Ip) and the common mode current (Icm); and wherein the negative output current (Ioutn) is generated from the negative current (In) and the common mode current (Icm). In some embodiments, the system includes a sensor operable to sense phenomena and generate the positive voltage input signal (Vp) and the negative voltage input sign (Vn). The system may further include common mode virtual ground control circuitry operable to sense current output voltages of positive output current (Ioutp) and negative output current (Ioutn) and create common mode feedback to maintain a predetermined interface voltage. The system may further include an analog to digital converter coupled to receive the positive output current (Ioutp) and the negative output current (Ioutn).

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

The systems and methods of the present disclosure provide improved techniques for designing, implementing and operating programmable gain amplifiers. In some embodiments, a programmable gain amplifier comprises a three-stage class AB amplifier with improved total harmonic distortion (THD) and wider signal headroom from a circuit arrangement that does not require a tail current source.

A programmable gain amplifier of the present disclosure may be employed in an audio processing system. For example, an audio sensor (e.g., a microphone) detects sound signals in an environment and generates an audio signal for amplification by the programmable gain amplifier. It will be appreciated that the disclosed programmable gain amplifier may be used for other amplifier applications, such as wireless medical sensor devices, sensor input systems, and other amplifier applications in accordance with the teachings herein.

Figure 1A:
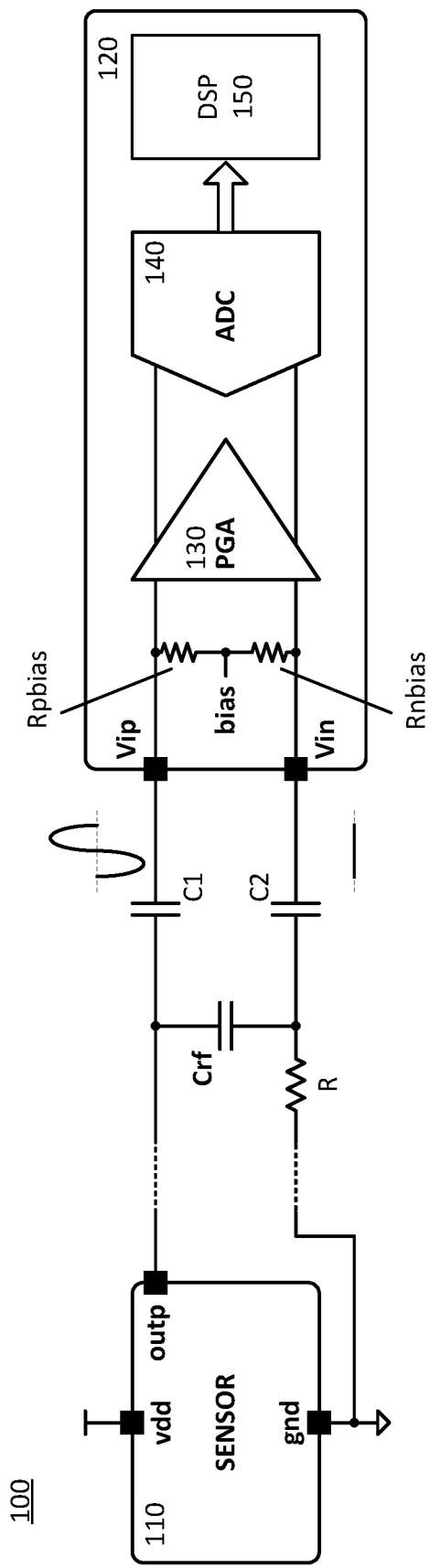
FIG. 1A is an example processing system with a single-ended sensor input, in accordance with one or more embodiments.

Referring to FIG. 1A, an example input processing system 100, in accordance with one or more embodiments, will be described. The input processing system 100 includes a single-ended sensor 110 coupled to a signal processing module 120. The sensor 110 is connected to a voltage power source via a power supply terminal (vdd) and connected to ground via a ground terminal (gnd). The sensor 110 detects phenomena (e.g., acoustic waves), generates corresponding voltage signals and outputs on positive output terminal (outp) a positive voltage output signal that represents the sensor signals. In some embodiments, the sensor 110 is an audio sensor for generating audio signals and the signal processing module 120 processes the audio signals for use in one or more audio applications such as audio recording, voice transmission, voice command processing, and other audio applications.

The signal processing module 120 includes bias resistors Rvbias, Rnbias, a programmable gain amplifier 130, an analog to digital converter (ADC) 140, and a digital signal processor (DSP) 150. It should be noted that the signal processing module 120 is illustrated for simplicity and may include different and/or additional components that are not shown in this figure.

The positive output terminal (outp) and ground terminal (gnd) of the sensor 110 are connected to the positive voltage input terminal (Vip) and negative voltage input terminal (Vin), respectively, of the signal processing module 120 via a resistor R and capacitors Crf, C1, C2. As such, the sensor 110 is connected in a pseudo-differential fashion to the programmable gain amplifier 130. In the embodiment shown, resistor R balances the source impedance in the single ended case (single ended sensor 110), and capacitor Crf operates as a filter capacitor to filter out noise in the signal. Capacitors C1, C2 are alternating current (AC) coupling capacitors that operate to block the unknown direct current (DC) level of the signals, while allowing for optimal DC biasing for the inputs to the programmable gain amplifier 130.

After the signal processing module 120 receives a positive input signal on its positive voltage input terminal (Vip) and receives a negative input signal on its negative voltage input (Vin), the bias resistors Rvbias, Rnbias of the signal processing module 120 provide DC bias to nodes Vip and Vin. The resultant signals are then fed into the programmable gain amplifier 130, which amplifies the resultant signals to produce amplified output signals. The amplified output signals are then fed into the ADC 140, which converts the amplified output signals from analog signals to digital signals. The digital signals are then inputted into the DSP 150 for further processing.

Figure 1B:
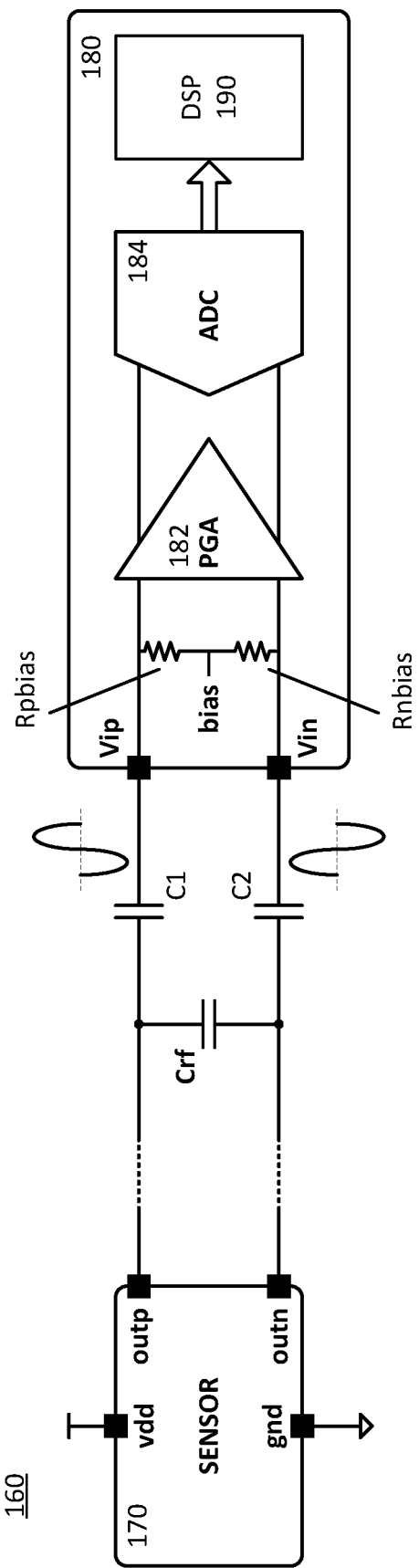
FIG. 1B is an example processing system with a fully-differential sensor input, in accordance with one or more embodiments.

Referring to FIG. 1B, another example input processing system 160, in accordance with one or more embodiments, will now be described. The input processing system 160 includes a fully-differential sensor 170 and a signal processing module 180 (e.g., signal processing module 120 of FIG. 1A). The fully-differential sensor 170 is connected to a voltage power source via its power supply input terminal (vdd) and connected to ground via ground terminal gnd. In one embodiment, the fully-differential sensor 170 includes an audio sensor to generate audio signals and the signal processing module 180 processes the audio signals for use in one or more audio applications such as audio recording, voice transmission, voice command processing, and other audio applications. The fully-differential sensor 170 processes the sensor signals, and outputs on its positive output terminal outp a positive voltage output signal and on its negative output terminal outn a negative voltage signal that represents the sensed signals.

The signal processing module 180 includes bias resistors Rvbias, Rnbias, a programmable gain amplifier 182, an analog to digital converter (ADC) 184, and a digital signal processor (DSP) 190. The positive output terminal outp and negative output terminal outn of the fully-differential sensor 170 are connected to the positive voltage input terminal Vip and negative voltage input terminal Vin, respectively, of the signal processing module 180 via capacitors Crf, C1, C2. As such, the fully-differential sensor 170 is connected in a fully-differential fashion to the programmable gain amplifier 182.

In the illustrated embodiment, capacitor Crf provides anti-aliasing, and capacitors C1, C2 are alternating current (AC) coupling capacitors that operate to block the unknown direct current (DC) level of the signals, while allowing for optimal DC biasing for the inputs to the programmable gain amplifier 182.

After the signal processing module 180 receives the positive input signal on its positive voltage input terminal Vip and receives the negative input signal on its negative voltage input terminal Vin, the bias resistors Rvbias, Rnbias of the signal processing module 180 establish the common DC voltage on both input terminals Vip and Vin for input to the programmable gain amplifier 182. In various embodiments, the input impedance at terminals Vip and Vin is relatively high to reduce loss of the sensor (e.g., a microphone) signal. The resultant signals are then fed into the programmable gain amplifier 182, which amplifies the signals to produce amplified output signals. The amplified output signals are then fed to the ADC 184, which converts the amplified output signals from analog signals to digital signals. The digital signals are then inputted into the DSP 190 for further processing.

In various embodiments, the sensor 110 (FIG. 1A) and the fully-differential sensor 170 (FIG. 1B) may include different types of sensors including, but not limited to, an audio sensor (e.g., a microphone), a pressure sensor, a temperature sensor, a wireless sensor, and a photo sensor. Further, the signal processing module 120 (FIG. 1A) and the signal processing module 180 (FIG. 1B) may include different types of processing systems including, but not limited to, an audio processing system, a medical sensor device, a pressure processing system, a temperature processing system, and an image processing system.

In various embodiments, the programmable gain amplifier (e.g., programmable gain amplifier 130 or programmable gain amplifier 182) is designed to reduce or minimize the number of noise contributing components while maintaining high input impedance, low total harmonic distortion (THD), high signal-to-noise ratio (SNR) and/or high dynamic range (DR). In some embodiments, noise sources in the PGA include gain setting resistors providing low noise and high gain. In some embodiments, the resistor values are relatively low and are not connected directly to the sensor, but buffered by an active circuit (e.g., MOSFET).

The programmable gain amplifiers of the present disclosure may provide numerous advantages over conventional approaches. For example, some conventional approaches implement programmable gain amplifiers having two operational amplifiers, thereby doubling the active noise sources. Another conventional approach is a resistive inverting input amplifier which uses one operational amplifier. However, in such designs the input resistance is decreased to increase gain, which increases the loading on the microphone signal and undesirably affects the input AC coupling time constant. In another approach, a high input impedance transconductance circuit (gMR) can be designed to convert voltage into current with a low number of noise contributing elements, but these conventional circuits have poor THD and linearity.

Figure 2:
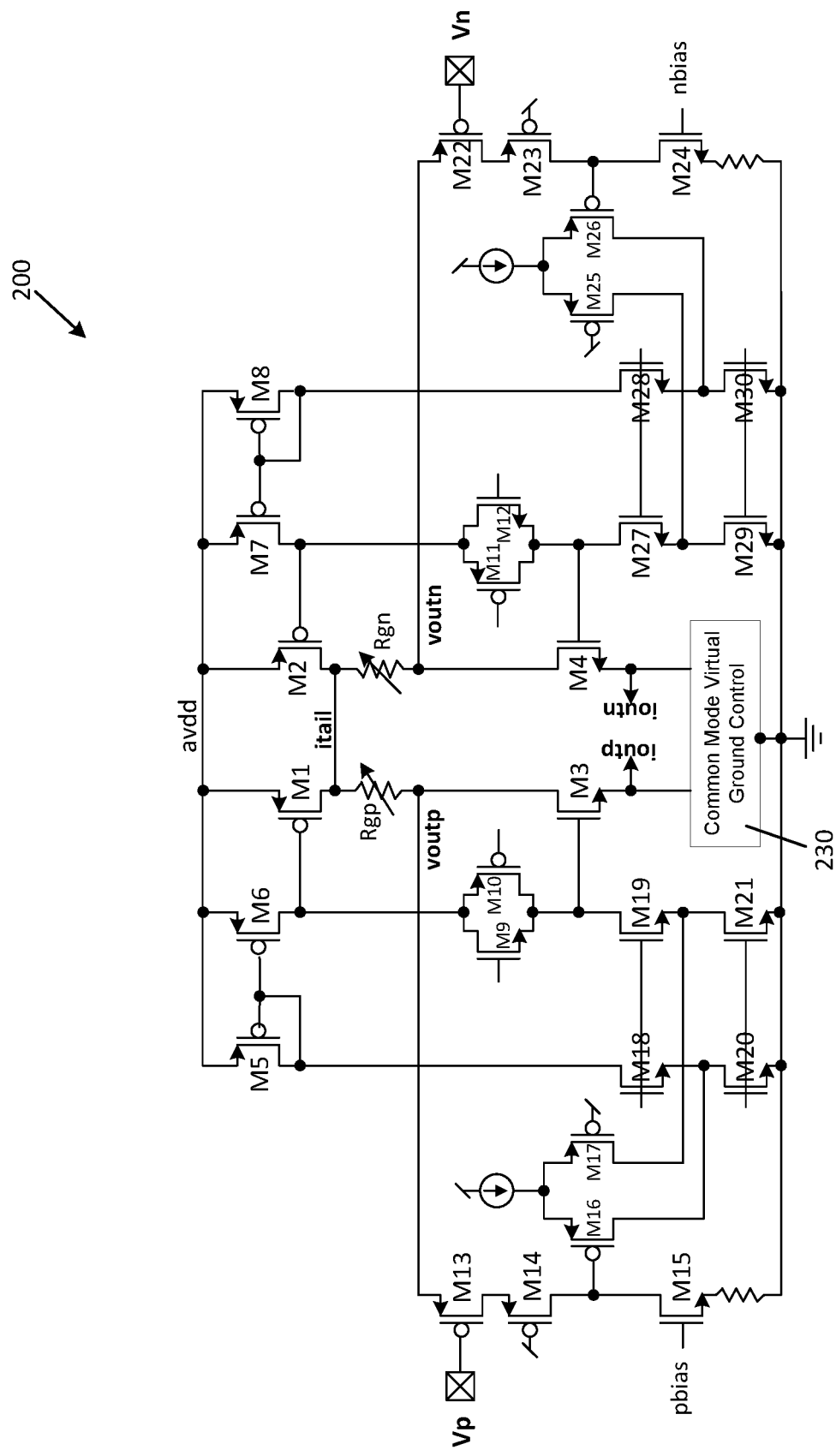
FIG. 2 illustrates an example programmable gain amplifier circuit, in accordance with one or more embodiments.

An example programmable gain amplifier circuit, in accordance with one or more embodiments, will now be described in greater detail with reference to FIG. 2. The illustrated circuit provides the benefits of an efficient class AB output stage in a voltage to current circuit. The programmable gain amplifier circuit 200 is a low power three-stage class AB amplifier with improved THD and internal node headroom. The circuitry illustrated in FIG. 2 is exemplary circuitry that may be used for the programmable gain amplifier 130 of FIG. 1A and the programmable gain amplifier 182 of FIG. 1B. As such, it is understood that different circuitry implementations may be used in accordance with the teachings of the present disclosure.

In the illustrated embodiment of FIG. 2, a programmable gain amplifier circuit 200 is a linearized, multistage class AB amplifier that is connected to a power source avdd and includes three stages: (i) a source follower and common source input stage; (ii) a folded-cascade stage; and (iii) an improved class AB voltage output stage. The programmable gain amplifier circuit 200 includes an input node Vp from a sensor which is connected to a PMOS transistor M13, and an input node Vn from the sensor which is connected to a PMOS transistor M22. The PMOS transistor M13, through cascade transistor M14, is connected to NMOS circuit M15 (with a resistor), which is connected to pbias at the gate input. The PMOS transistor M22, through cascade transistor M23, is connected to NMOS transistor M24 (with a resistor), which is connected to nbias at the gate input.

The class AB output stage includes a programmable variable gain resistor Rgp connected between voltage output node voutp and transistor M1, a programmable variable gain resistor Rgn connected between voltage output node voutn and transistor M2, and a current tail (itail) connection coupled between the Rgp/M1 and Rgn/M2 connections. Feedback connections are provided from voutp to M13 and voutn to M22, such that the voltage at voutp and voutn is approximately the same as the input nodes Vp and Vn after level shifting. The gain setting of the programmable gain amplifier may be adjusted by changing the value of variable gain resistors Rgp and Rgn, resulting in a desired voltage to current transformation.

The arrangement illustrated in FIG. 2 provides a class AB output stage in an arrangement providing desired voltage to current gain and high linearity (e.g., via voltage feedback loop), and connects the top two transistors (M1 and M2) such that the current coming down from the top (i.e., from itail) is common mode and rejected at the output stage. In some embodiments, a class AB voltage output stage is modified to include a voltage to current variable resistor circuit arrangement including a common mode connection at the top.

In the illustrated embodiment, the voltage at the voutp node and the voutn node is highly linear and the current that flows through the resistors Rgp and Rgn is output through positive output current (ioutp) node and negative output current (ioutn) node, respectively. The current is extracted from the ioutp node and ioutn node and provided to an analog to digital converter (e.g., ADC 140 of FIG. 1A or ADC 184 of FIG. 1B) as a current mode input. The voltage output levels of ioutp and ioutn are maintained by common mode/virtual ground control circuit 230.

In some embodiments, transistors M1 through M30 of the programmable gain amplifier circuit 200 include metal-oxide-semiconductor field-effect transistors (MOSFETs). A folded cascade stage p, including transistors M5, M6, M16, M17, M18, M19, M20, and M21, has a differential p input (transistors M16 and M17) connected to a current source. The folded-cascade stage p is connected to the class AB output stage, which includes transistors M9 and M10, which bias output stage bias transistors M1 and M3. Similarly, a folded cascade stage n, including transistors M7, M8, M25, M26, M27, M28, M29, and M30, has differential n input (transistors M25 and M26) connected to a current source. The folded-cascade stage n is connected to a class AB output stage, which is formed from transistors M11 and M12, which bias output stage bias transistors M2 and M4. In various embodiments, the gate control signals in the class AB output stages may include conventional class AB gate control signaling.

In operation, the programmable gain amplifier circuit 200 provides a high input impedance buffer to the input sensor (e.g., a microphone) and derives a linear voltage that drives the low resistance variable gain resistors (Rgp and Rgn). In some embodiments, the programmable gain amplifier circuit 200 is a coupled three stage class AB voltage buffer that provides lower THD due to a higher gain linearization loop. In some embodiments, the output voltage at nodes voutp and voutn are equal to the swings at the input, while the voltage at other nodes in the circuit are relatively low.

Figure 3:
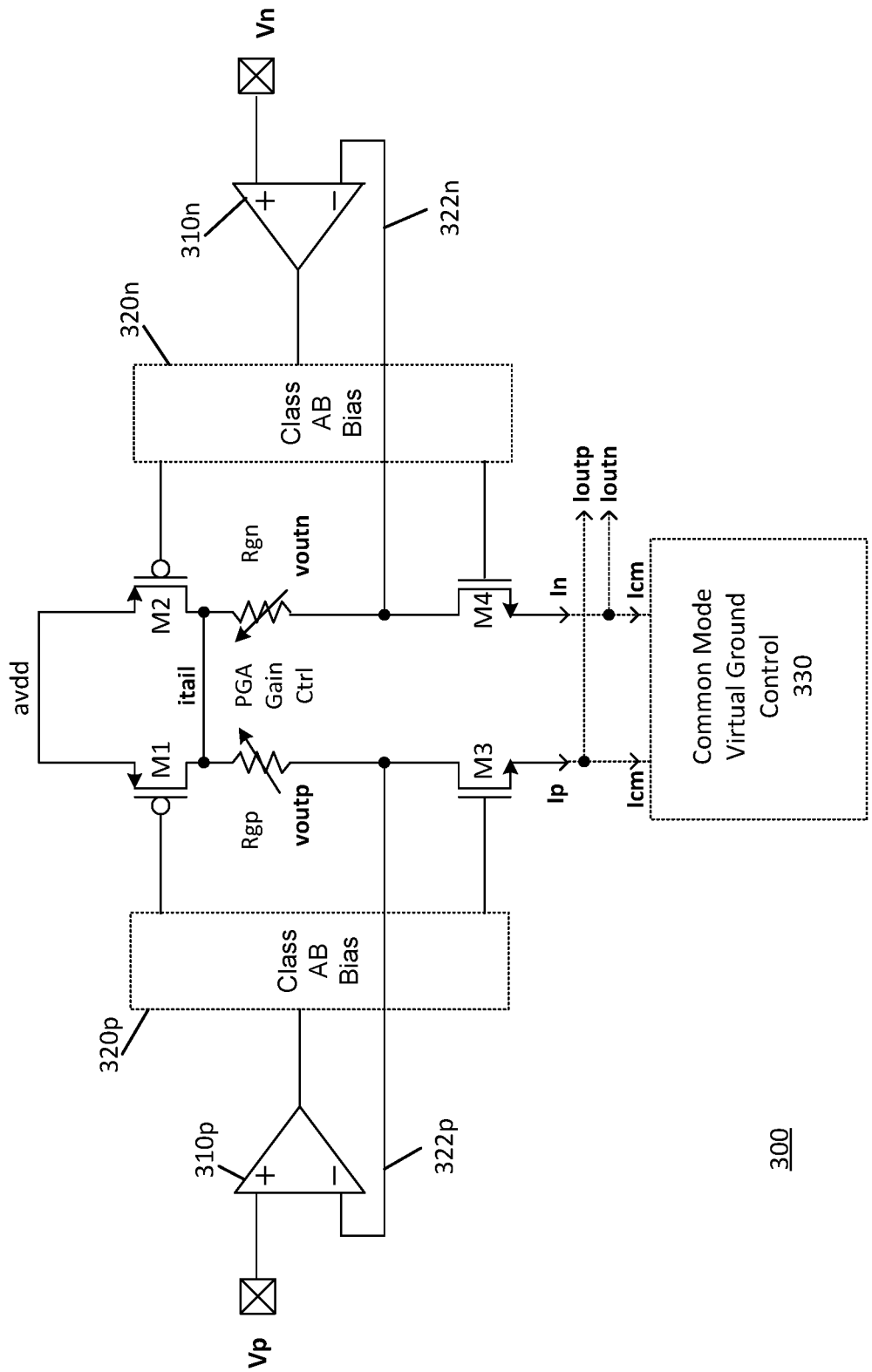
FIG. 3 illustrates design details of a programmable gain amplifier, in accordance with one or more embodiments.

Referring to FIG. 3, an operation of a programmable gain amplifier in accordance with one or more embodiments will now be described. A programmable gain amplifier 300 includes two operational amplifiers 310p, 310n; two class AB bias circuits 320p, 320n; two MOSFET transistor pairs M1, M2 and M3, M4; two variable gain resistors Rgp, Rgn; and a common mode virtual ground control 330. Each source of transistor M1 and M2 is connected to a power supply voltage avdd (e.g., eighteen volts). The positive and negative sides of the programmable gain amplifier 300 mirror each other and, as such, operate similarly. It will be appreciated that the programmable gain amplifier 300 is an example embodiment and that other circuit configurations, including the programmable gain amplifier circuit 200 of FIG. 2, may operate in a similar manner. For example, although two operational amplifiers 310p and 310n are shown in FIG. 3, other input circuitry may be used (e.g., corresponding circuitry in FIG. 2) in accordance with the teachings of the present disclosure.

The programmable gain amplifier 300 is a closed loop system with a feedback 322p back to the input operational amplifier 310p and a feedback 322n back to the input operational amplifier 310n. The itail connection allows the PMOS transistors M1 and M2 to deliver common mode current to the resistors Rgp and Rgn. In various embodiments, resistors Rgp and Rgn are matched and the current that comes down from the itail node to the current output is common mode and is rejected, leaving the desired signal. If the gain of the resistors Rgp and Rgn are not matched (e.g., set to the same resistance), some of the common mode current may be mixed into the differential path and degrade the THD.

During operation of the programmable gain amplifier 300, a positive voltage input signal (Vp) is input into the operational amplifier 310p, along with feedback from a positive voltage output signal (voutp) generated by the programmable gain amplifier 300. The operational amplifier 310p outputs a difference signal (e.g., a positive voltage difference signal) corresponding to the difference (e.g., the voltage difference) between the two inputted signals. The difference signal is input to the class AB bias circuit 320p (e.g., a first bias circuit).

The class AB bias circuit 320p is operable to provide class AB gate control signals to drive the transistor M1 to correct for the difference between the positive voltage input signal (Vp) and the positive voltage output signal (voutp), and to drive the transistor M3. The resistance of the variable gain resistors Rgp and Rgn are adjusted to provide for gain control for the programmable gain amplifier 300 and are matched. A tail current (itail) supplies current to transistors M3 and M4 and provides continuity of the output signals (Ioutp and Ioutn) during voltage transitions to the programmable gain amplifier 300.

The gate of transistor M3 is driven to cause transistor M3 to produce a positive current (Ip), which is proportional to the difference between the positive voltage input signal (Vp) and the positive voltage output signal (voutp), and to produce a common mode current (Icm). A positive output current (Ioutp) is produced from the positive current (Ip) and the common mode current (Icm). The positive output current (Ioutp) is then fed into a current source analog to digital converter to convert the positive output current (Ioutp) from an analog signal to a digital signal.

A negative voltage input signal (Vn) and a negative voltage output signal (voutn) are inputted into the operational amplifier 310n. The operational amplifier 310n outputs a difference signal (e.g., a negative voltage difference signal) corresponding to the difference (e.g., the voltage difference) between the inputted signals. The difference signal is inputted into the class AB bias circuit 320n (e.g., a second bias circuit). The class AB bias circuit 320*n* drives the gate of transistor M2 to correct for the difference between the negative voltage input signal (Vn) and the negative voltage output signal (voutn) and drive the gate of transistor M4.

The gate of transistor M4 is driven to cause transistor M4 to produce a negative current (In), which is proportional to the difference between the negative voltage input signal (Vn) and the negative voltage output signal (voutn), and to produce a common mode current (Icm). A negative output current (Ioutn) is produced from the negative current (In) and the common mode current (Icm). The negative output current (Ioutn) is fed into a current mode ADC to convert the negative output current (Ioutn) from an analog signal to a digital signal.

The common mode virtual ground control 330 maintains the voltage output levels of the positive output current (Ioutp) and the negative output current (Ioutn) such that they are compatible with the current mode ADC. Embodiments of example common mode virtual ground control circuits suitable for use in the programmable operational amplifier 300 are described below with respect to FIG. 5.

Figure 4:
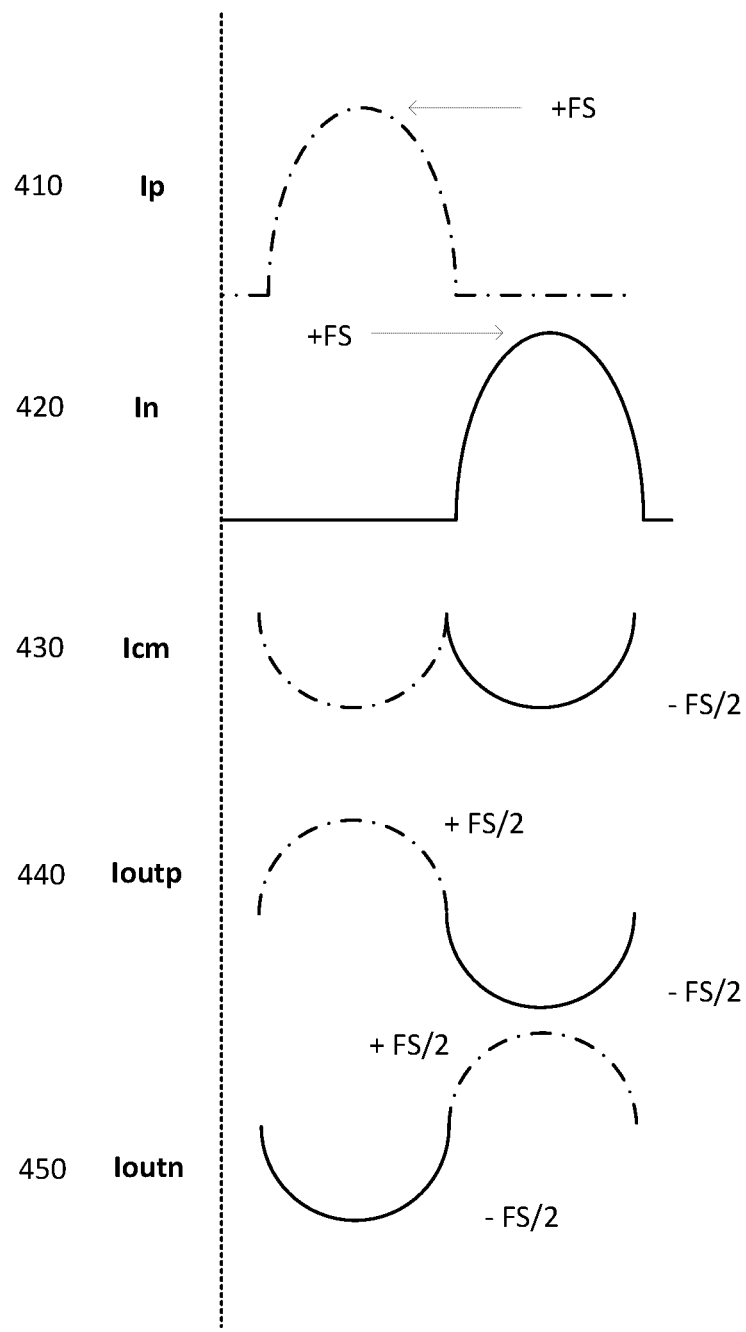
FIG. 4 shows graphs illustrating currents generated by a programmable gain amplifier, in accordance with one or more embodiments.

FIG. 4 shows graphs 410, 420, 430, 440, 450 illustrating the currents (Ip, In, Icm, Ioutp, Ioutn) generated by a programmable gain amplifier, in accordance with one or more embodiments. As illustrated, graph 410 shows the positive current (Ip) over time with a peak current of +FS, and graph 420 shows the negative current (In) over time with a peak current of −FS. As previously mentioned above, these signals (Ip and In) continue for more than half a cycle of the waveform.

Also illustrated in FIG. 4, graph 430 shows the common mode current (Icm) plotted over time. The waveform of the common mode current (Icm) is shown to always be negative and have a peak current of −FS/2. Graph 440 in FIG. 4 shows the positive output current (Ioutp) over time. The positive output current (Ioutp) is generated from the combination of the positive current (Ip) and the common mode current (Icm) and has a waveform that is sinusoidal with peaks at +FS/2 and −FS/2. Also, Graph 450 in FIG. 4 shows the negative output current (Ioutn) over time. The negative output current (Ioutn) is generated from the combination of the negative current (In) and the common mode current (Icm) and has a waveform that is sinusoidal with peaks at +FS/2 and −FS/2.

Figure 5:
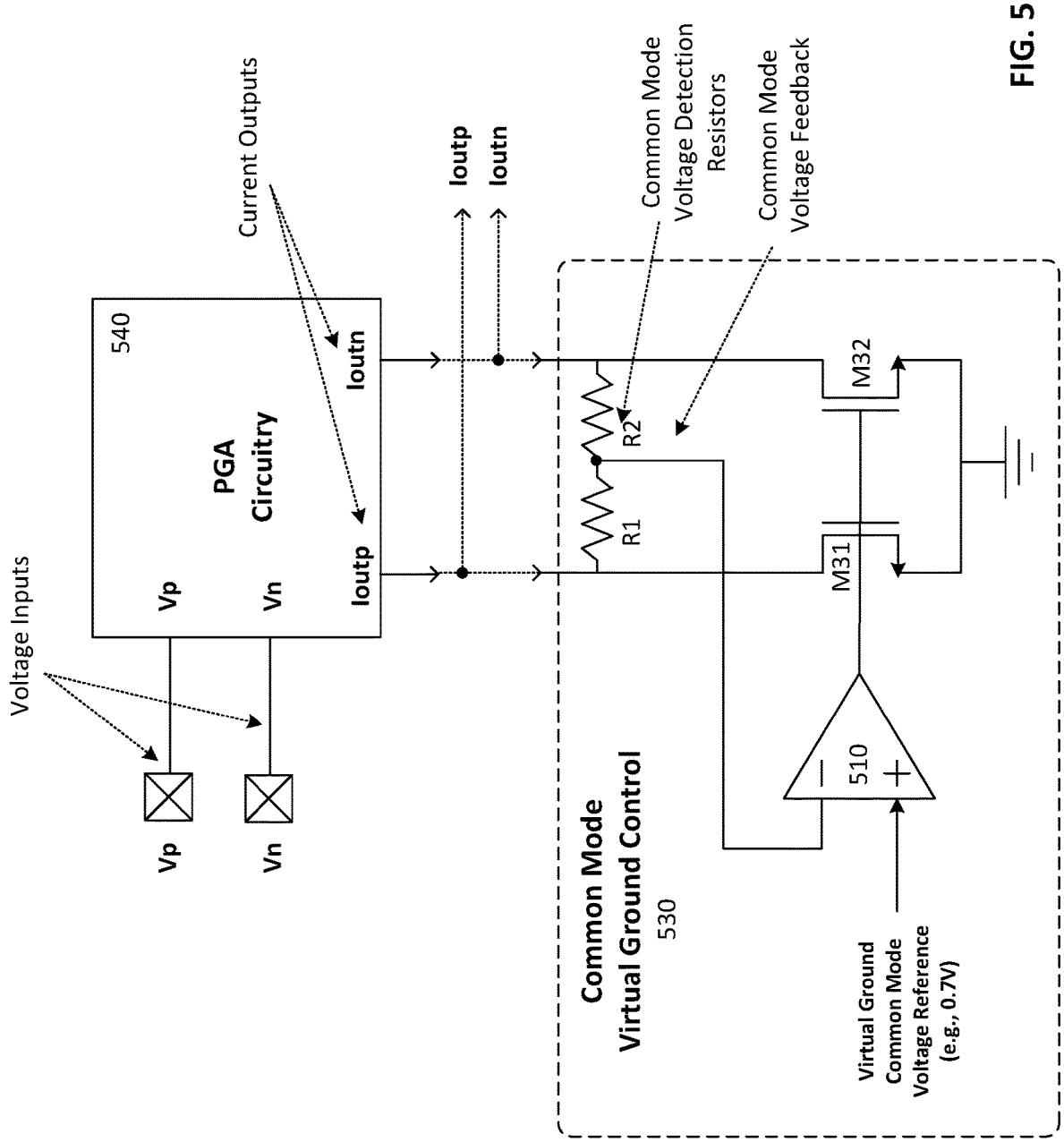
FIG. 5 illustrates an example circuit that may be utilized for the common mode virtual ground control of a programmable gain amplifier, in accordance with one or more embodiments.

FIG. 5 illustrates an example circuit that may be utilized for the common mode virtual ground control of a programmable gain amplifier, in accordance with one or more embodiments. The output of the programmable gain amplifier is a current which may be provided to an analog to digital converter having current mode input. The common mode virtual ground control circuit senses the voltages at the current output nodes (e.g., current output Ioutp and current output Ioutn) and creates common mode feedback to maintain the correct voltage for the interface.

As illustrated, programmable gain amplifier circuitry 540 receives input voltages Vp and Vn from an input sensor (e.g., a microphone) and outputs currents ioutp and ioutn (e.g., to a current mode analog to digital converter, such as ADC 140 in FIG. 1A). The output currents ioutp and ioutn are connected to common mode virtual ground control circuitry 530. In various embodiments, the components of FIG. 5 may include corresponding circuitry as illustrated in FIGS. 1-3.

The exemplary common mode virtual ground control circuitry 530 includes an operational amplifier 510, resistors R1, R2, and MOSFET transistors M31 and M32. The resistors R1 and R2 function as common mode detection circuit, with the node between the resistors connected to the operational amplifier 510 providing a common mode feedback loop. The common mode virtual ground control circuitry 530 operates to maintain the voltage of the positive output current (Ioutp) and the negative output current (Ioutn) to be a voltage (e.g., a predetermined voltage such as 0.7 volts) that is compatible with a current mode ADC or other connected component as applicable.

During operation of the common mode virtual ground control circuitry 530, the operational amplifier 510 receives the voltage of the positive output current (Ioutp) and the negative output current (Ioutn) with the desired voltage. The operational amplifier 510 outputs a difference signal corresponding to the difference between the voltages. The difference signal drives the gates of transistors M31 and M32 to correct for the difference between the voltage of the positive output current (Ioutp) and the negative output current (Ioutn) with the desired voltage.

Figure 6:
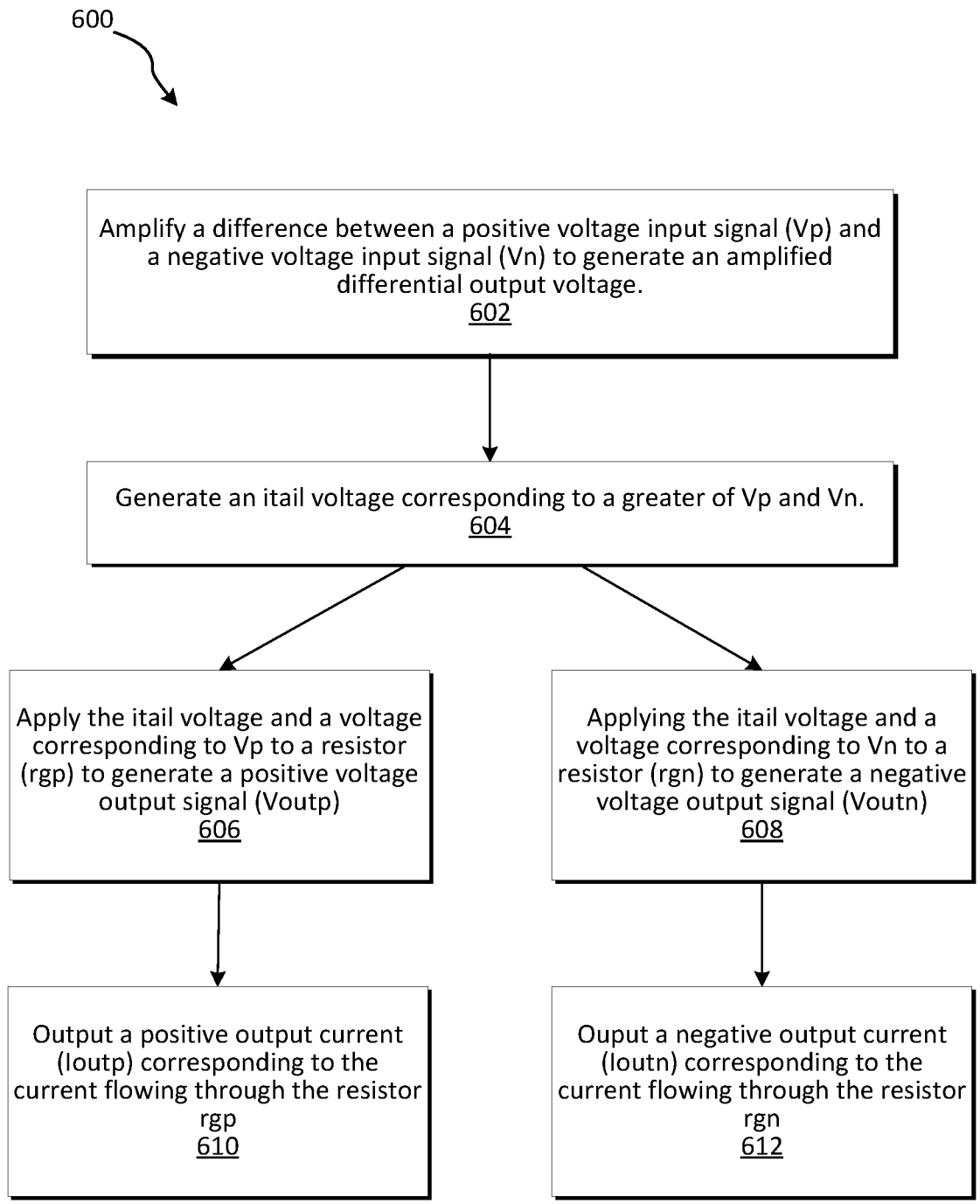
FIG. 6 illustrates an example method for amplifying an input signal, in accordance with one or more embodiments.

An exemplary method 600 for amplifying an input signal, in accordance with one or more embodiments, will now be described with reference to FIG. 6. In various embodiments, the method 600 may be implemented by circuitry including a programmable gain amplifier as illustrated in FIG. 2, FIG. 3 and/or FIG. 5. In step 602, a difference between a positive voltage input signal (Vp) and a negative voltage input (Vn) are amplified to generate an amplified differential output voltage. In some embodiments, a sensor (e.g., an audio sensor) senses phenomena (e.g., acoustic waves) and generates corresponding positive voltage input and negative voltage input signals.

In some embodiments, amplifying the difference between the positive voltage input signal (Vp) and the negative voltage input signal (Vn) to generate the amplified differential output voltage further includes generating a positive voltage difference signal corresponding to the difference between the positive voltage input signal (Vp) and the positive voltage output signal (Voutp), and generating a negative voltage difference signal corresponding to the difference between the negative voltage input signal (Vn) and the negative voltage output signal (Voutn). The step of applying (step 602) may be further include generating, by a first bias circuit, first gate control signals to drive a first transistor to correct for the positive voltage difference signal, and a third transistor to produce a positive current (Ip) and a common mode current (Icm), and generating, by a second bias circuit, second gate control signals to drive a second transistor to correct for the negative voltage difference signal and a fourth transistor to produce a negative current (In) and the common mode current (Icm). In some embodiments, the first bias circuit and second bias circuit are class AB bias circuits as disclosed herein.

An itail voltage corresponding to the greater of Vp and Vn is generated (step 604), and applied to a pair of resistors, rgp and rgn. The itail voltage and a voltage corresponding to Vp are applied to resistor rgp to generate a positive voltage output signal Voutp (step 606). The itail voltage and a voltage corresponding to Vn are applied to resistor rgn to generate a negative voltage output signal Voutn (step 608). In some embodiments, the resistors are variable gain resistors, and the method includes adjusting, using the variable gain resistors, a gain applied to the positive voltage output signal (Voutp) and the negative voltage output signal (Voutn).

In step 610, the circuitry outputs a positive output current (Ioutp) corresponding to the current flowing through the resistor rgb. In various embodiments, when Vp>Vn then the positive output current (Ioutp) is proportional to the positive voltage input signal (Vp) minus the negative voltage input signal (Vn). In some embodiments, when Vn>Vp, the positive current output (Ioutp) is maintained in a low power or quiescent state. In some embodiments, when Vn>Vp, the positive current output (Ioutp) signal is approximately zero.

In step 612, the circuitry outputs a negative output current (Ioutn) corresponding to the current flowing through the resistor rgn. In various embodiments, when Vn>Vp then the negative output current (Ioutn) is proportional to the negative voltage input signal (Vn) minus the positive voltage input signal (Vp). In some embodiments, when Vp>Vn, the negative current output (Ioutn) is maintained in a low power or quiescent state. In some embodiments, when Vp>Vn, the negative current output (Ioutn) signal is approximately zero.

In some embodiments, the positive output current (Ioutp) is generated from the positive current (Ip) and a common mode current (Icm), and the negative output current (Ioutn) is generated from the negative current (In) and the common mode current (Icm). The method may further include sensing current output voltages of positive output current (Ioutp) and negative output current (Ioutn) and creating common mode feedback to maintain a predetermined interface voltage. In various embodiments, the positive output current and negative output current are provided to an analog to digital converter.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the scope of the present disclosure. Where applicable, the various hardware components and/or software components set forth herein may be separated into sub-components comprising software, hardware, or both without departing from the scope of the present disclosure. In addition, as used herein the term "coupled" may include both direct and indirect coupling, and the term "connected" may include both direct and indirect connections, between various hardware components. Where applicable, it is contemplated that software components may be implemented as hardware components and vice versa.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A method comprising:
    amplifying a difference between a positive voltage input signal (Vp) and a negative voltage input signal (Vn) to generate an amplified differential output voltage comprising a positive voltage output signal (Voutp) and a negative voltage output signal (Voutn);
    generating an itail voltage corresponding to a greater of the positive voltage input signal (Vp) and the negative voltage input signal (Vn);
    applying the itail voltage and a first voltage corresponding to the positive voltage input signal (Vp) to a first resistor (rgp) to generate the positive voltage output signal (Voutp); and
    applying the itail voltage and a second voltage corresponding to the negative voltage input signal (Vn) to a second resistor (rgn) to generate the negative voltage output signal (Voutn);
    outputting a positive output current (Ioutp) corresponding to the current flowing through the first resistor (rgp), wherein if the positive voltage input signal (Vp) is greater than the negative voltage input signal (Vn), the positive output current (Ioutp) is proportional to the positive voltage input signal (Vp) minus the negative voltage input signal (Vn); and
    outputting a negative output current (Ioutn) corresponding to the current flowing through the second resistor (rgn), wherein if the negative voltage input signal (Vn) is greater than the positive voltage input signal (Vp), the negative output current (Ioutn) is proportional to the negative voltage input signal (Vn) minus the positive voltage input signal (Vp).

2. The method of claim 1 further comprising generating, by a sensor in response to sensed phenomena, the positive voltage input signal (Vp) and the negative voltage input signal (Vn).

3. The method of claim 1, wherein amplifying the difference between the positive voltage input signal (Vp) and the negative voltage input signal (Vn) to generate the amplified differential output voltage further comprises:
    generating a positive voltage difference signal corresponding to the difference between the positive voltage input signal (Vp) and the positive voltage output signal (Voutp); and
    generating a negative voltage difference signal corresponding to the difference between the negative voltage input signal (Vn) and the negative voltage output signal (Voutn).

4. The method of claim 3, wherein amplifying the difference between the positive voltage input signal (Vp) and the negative voltage input signal (Vn) to generate the amplified differential output voltage further comprises:
    generating, by a first bias circuit, first gate control signals to drive a first transistor to correct for the positive voltage difference signal, and a third transistor to produce a positive current (Ip) and a common mode current (Icm); and
    generating, by a second bias circuit, second gate control signals to drive a second transistor to correct for the negative voltage difference signal and a fourth transistor to produce a negative current (In) and the common mode current (Icm).

5. The method of claim 4, wherein the positive output current (Ioutp) is generated from the positive current (Ip) and the common mode current (Icm); and wherein the negative output current (Ioutn) is generated from the negative current (In) and the common mode current (Icm).

6. The method of claim 5, further comprising sensing current output voltages of positive output current (Ioutp) and negative output current (Ioutn) and creating common mode feedback to maintain a predetermined interface voltage.

7. The method of claim 6, further comprising transmitting the positive output current (Ioutp) and the negative output current (Ioutn) to an analog to digital converter.

8. The method of claim 4, wherein the positive current (Ip) is proportional to the difference between the positive voltage input signal (Vp) and the positive voltage output signal (voutp); and wherein the negative current (In) is proportional to the difference between the negative voltage input signal (Vn) and the negative voltage output signal (voutn).

9. The method of claim 1, wherein when the positive voltage input signal (Vp) is greater than the negative voltage input signal (Vn), the negative output current (Ioutn) is zero; and wherein when the negative voltage input signal (Vn) is greater than the positive voltage input signal (Vp), the positive output current (Ioutp) is zero.

10. The method of claim 1, wherein the first resistor and the second resistor are variable gain resistors; and wherein the method further comprises:

adjusting, using the variable gain resistors, a gain applied to the positive voltage output signal (Voutp) and the negative voltage output signal (Voutn).

11. A programmable gain amplifier comprising:

amplifier circuitry comprising positive voltage circuitry operable to receive and process a positive voltage input signal (Vp) and negative voltage circuitry operable to receive and process a negative voltage input signal (Vn), the amplifier circuitry operable to generate an amplified differential output voltage comprising a positive voltage output signal (Voutp) and a negative voltage output signal (Voutn);

an itail connection coupled between the positive voltage circuitry and the negative voltage circuitry, the itail connection operable to generate an itail voltage corresponding to a greater of the positive voltage input signal (Vp) and the negative voltage input signal (Vn);

a first resistor (rgp) disposed to receive the itail voltage and a first voltage corresponding to the positive voltage input signal (Vp) and operable to generate the positive voltage output signal (Voutp);

a second resistor (rgn) disposed to receive the itail voltage and a second voltage corresponding to the negative voltage input signal (Vn) and operable to generate the negative voltage output signal (Voutn);

a first current output node coupled to the output of the first resistor and operable to output a positive output current (Ioutp) corresponding to the current flowing through the first resistor (rgp), wherein if the positive voltage input signal (Vp) is greater than the negative voltage input signal (Vn), the positive output current (Ioutp) is proportional to the positive voltage input signal (Vp) minus the negative voltage input signal (Vn), otherwise the positive output current (Ioutp) is approximately zero; and a second current output node coupled to the output of the second resistor and operable to output a negative output current (Ioutn) corresponding to the current flowing through the second resistor (rgn), wherein if the negative voltage input signal (Vn) is greater than the positive voltage input signal (Vp), the negative output current (Ioutn) is proportional to the negative voltage input signal (Vn) minus the positive voltage input signal (Vp), otherwise the negative output current (Ioutn) is approximately zero.

12. The programmable gain amplifier of claim 11 further comprising a sensor operable to sense phenomena and generate the positive voltage input signal (Vp) and the negative voltage input sign (Vn).

13. The programmable gain amplifier of claim 11, wherein the amplifier circuitry further comprises:

a first operational amplifier operable to generate a positive voltage difference signal corresponding to the difference between the positive voltage input signal (Vp) and the positive voltage output signal (Voutp); and a second operational amplified operable to generate a negative voltage difference signal corresponding to the difference between the negative voltage input signal (Vn) and the negative voltage output signal (Voutn).

14. The programmable gain amplifier of claim 13, wherein the amplifier circuitry further comprises:

a first bias circuit operable to generate first gate control signals to drive a first transistor to correct for the positive voltage difference signal, and a third transistor to produce a positive current (Ip) and a common mode current (Icm); and a second bias circuit operable to generate second gate control signals to drive a second transistor to correct for the negative voltage difference signal and a fourth transistor to produce a negative current (In) and the common mode current (Icm).

15. The programmable gain amplifier of claim 14, wherein the positive output current (Ioutp) is generated from the positive current (Ip) and the common mode current (Icm); and wherein the negative output current (Ioutn) is generated from the negative current (In) and the common mode current (Icm).

16. The programmable gain amplifier of claim 15, further comprising common mode virtual ground control circuitry operable to sense current output voltages of positive output current (Ioutp) and negative output current (Ioutn) and create common mode feedback to maintain a predetermined interface voltage.

17. The programmable gain amplifier of claim 16, wherein the positive output current (Ioutp) and the negative output current (Ioutn) are coupled to an analog to digital converter.

18. The programmable gain amplifier of claim 14, wherein the positive current (Ip) is proportional to the difference between the positive voltage input signal (Vp) and the positive voltage output signal (voutp); and wherein the negative current (In) is proportional to the difference between the negative voltage input signal (Vn) and the negative voltage output signal (voutn).

19. The programmable gain amplifier of claim 11, wherein when the positive voltage input signal (Vp) is greater than the negative voltage input signal (Vn), the negative output current (Ioutn) (Ioutp) is zero; and wherein when the negative voltage input signal (Vn) is greater than the positive voltage input signal (Vp), the positive output current (Ioutp) is zero.

20. The programmable gain amplifier of claim 11, wherein the first resistor and the second resistor are variable gain resistors operable to adjust a gain applied to the positive voltage output signal (Voutp) and the negative voltage output signal (Voutn).

* * * * *

UNITED STATES PATENT AND TRADEMARK OFFICE
CERTIFICATE OF CORRECTION

PATENT NO. : 10,797,665 B2  
APPLICATION NO. : 16/234496  
DATED : October 6, 2020  
INVENTOR(S) : Brian Friend Page 1 of 1

It is certified that error appears in the above-identified patent and that said Letters Patent is hereby corrected as shown below:

In the Specification

In Column 6, Line 66, change "cascade" to --cascode--.

In Column 7, Line 1, change "cascade" to --cascode--.

In Column 7, Line 40, change "cascade" to --cascode--.

In Column 7, Line 43, change "folded-cascade" to --folded-cascode--.

In Column 7, Line 49, change "folded-cascade" to --folded-cascode--.

In the Claims

In Claim 19, Column 14, Line 53, change "output current (Ioutn) (Ioutp)" to --output current (Ioutn)--.

Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*